US011515513B2

(12) United States Patent
 Yang

(10) Patent No.: US 11,515,513 B2
(45) Date of Patent: Nov. 29, 2022

(54) METHOD FOR MANUFACTURING DISPLAY DEVICE INCLUDING BONDING FIRST MOTHER SUBSTRATE AND SECOND MOTHER SUBSTRATE WITH BUFFER SHEET

(71) Applicant: SHARP KABUSHIKI KAISHA, Sakai (JP)

(72) Inventor: Yixin Yang, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 211 days.

(21) Appl. No.: 16/976,472

(22) PCT Filed: Mar. 2, 2018

(86) PCT No.: PCT/JP2018/008073
§ 371 (c)(1),
(2) Date: Aug. 28, 2020

(87) PCT Pub. No.: WO2019/167266
PCT Pub. Date: Sep. 6, 2019

(65) Prior Publication Data
US 2021/0050559 A1 Feb. 18, 2021

(51) Int. Cl.
 *H01L 51/56* (2006.01)
 *H01L 27/32* (2006.01)
 *H01L 51/00* (2006.01)
(52) U.S. Cl.
 CPC .......... *H01L 51/56* (2013.01); *H01L 27/3244* (2013.01); *H01L 51/003* (2013.01);
 (Continued)

(58) Field of Classification Search
 None
 See application file for complete search history.

(56) References Cited

U.S. PATENT DOCUMENTS

2017/0194605 A1    7/2017 Kuji
2018/0081756 A1*   3/2018 Akasawa ................. G09G 3/32
 (Continued)

FOREIGN PATENT DOCUMENTS

JP      2011-003668 A       1/2011
JP      2011003668 A  *    1/2011
 (Continued)

*Primary Examiner* — J. E. Schoenholtz
(74) *Attorney, Agent, or Firm* — ScienBiziP, P.C.

(57) ABSTRACT

A display device manufacturing method according to the disclosure includes the steps of forming a first resin layer serving as a first flexible substrate on a first mother substrate, forming a first light-emitting layer on the first resin layer, and forming, on the first light-emitting layer, a first encapsulating layer encapsulating the first light-emitting layer, forming a second resin layer serving as a second flexible substrate on a second mother substrate, forming a second light-emitting layer on the second resin layer, and forming, on the second light-emitting layer, a second encapsulating layer encapsulating the second light-emitting layer, bonding the first mother substrate and the second mother substrate with a buffer sheet interposed between the first mother substrate and the second mother substrate so that the first encapsulating layer and the second encapsulating layer face each other, peeling the first resin layer from the first mother substrate in a state where the first resin layer and the second resin layer are layered with the buffer sheet interposed between the first resin layer and the second resin layer, and bonding a first support film to the first resin layer.

10 Claims, 4 Drawing Sheets

(52) U.S. Cl.
CPC .... *H01L 51/0097* (2013.01); *H01L 2227/326* (2013.01); *H01L 2251/5338* (2013.01); *H01L 2251/566* (2013.01)

(56) References Cited

U.S. PATENT DOCUMENTS

| | | | |
|---|---|---|---|
| 2018/0138461 A1 | 5/2018 | Kuji | |
| 2019/0391427 A1* | 12/2019 | Ikeda | H01L 29/7869 |
| 2020/0295057 A1* | 9/2020 | Yamazaki | H01L 29/7869 |

FOREIGN PATENT DOCUMENTS

| | | | |
|---|---|---|---|
| JP | 2014-041187 A | | 3/2014 |
| JP | 2017-123216 A | | 7/2017 |
| JP | 2018-026260 A | | 2/2018 |
| JP | 2018026260 A | * | 2/2018 |

\* cited by examiner

METHOD FOR MANUFACTURING DISPLAY DEVICE INCLUDING BONDING FIRST MOTHER SUBSTRATE AND SECOND MOTHER SUBSTRATE WITH BUFFER SHEET

TECHNICAL FIELD

The disclosure is related to a display device manufacturing method.

BACKGROUND ART

A display device manufacturing method is known in which, after a resin layer and a plurality of organic EL display portions are formed on a glass substrate, the resin layer is severed to obtain individually separated organic EL display portions (see, for example, PTL 1). This manufacturing method enables simultaneous production of a plurality of organic EL display portions, and the production efficiency can be improved.

CITATION LIST

Patent Literature

PTL 1: JP 2017-123216 A

SUMMARY

Technical Problem

However, in a known manufacturing method, it is necessary to perform a step of removing the resin layer from the glass substrate, a step of severing the resin layer, and the like for each glass substrate, and thus, the production efficiency is reduced.

The disclosure has been made in view of the above circumstances, and provides a display device manufacturing method by which the production efficiency of the display device can be improved.

Solution to Problem

The disclosure provides a display device manufacturing method including the steps of forming a first resin layer serving as a first flexible substrate on a first mother substrate, forming a first light-emitting layer on the first resin layer, and forming, on the first light-emitting layer, a first encapsulating layer encapsulating the first light-emitting layer, forming a second resin layer serving as a second flexible substrate on a second mother substrate, forming a second light-emitting layer on the second resin layer, and forming, on the second light-emitting layer, a second encapsulating layer encapsulating the second light-emitting layer, bonding the first mother substrate and the second mother substrate with a buffer sheet interposed between the first mother substrate and the second mother substrate so that the first encapsulating layer and the second encapsulating layer face each other, peeling the first resin layer from the first mother substrate in a state where the first resin layer and the second resin layer are layered with the buffer sheet interposed between the first resin layer and the second resin layer, and bonding a first support film to the first resin layer.

Advantageous Effects of Disclosure

The manufacturing method according to the disclosure includes a step of bonding a first mother substrate and a second mother substrate with a buffer sheet interposed between the first mother substrate and the second mother substrate so that a first encapsulating layer and a second encapsulating layer face each other. As a result of this step, a first resin layer, a first light-emitting layer, and the first encapsulating layer which are formed on the first mother substrate can be formed integrally with a second resin layer, a second light-emitting layer, and the second encapsulating layer which are formed on the second mother substrate, and a step of peeling the resin layer from the mother substrate, a step of bonding a support film to the resin layer, and the like can be performed in a state where the first and second resin layers and the like are integrally formed. As a result, the production efficiency of the display device can be improved.

Further, the first mother substrate and the second mother substrate are bonded with the buffer sheet interposed between the first mother substrate and the second mother substrate, and thus, a layered body including the first and second resin layers can have sufficient strength. Furthermore, damage to the first and second light-emitting layers and to first and second encapsulating layers can be suppressed.

DESCRIPTION OF EMBODIMENTS

Figure 1:
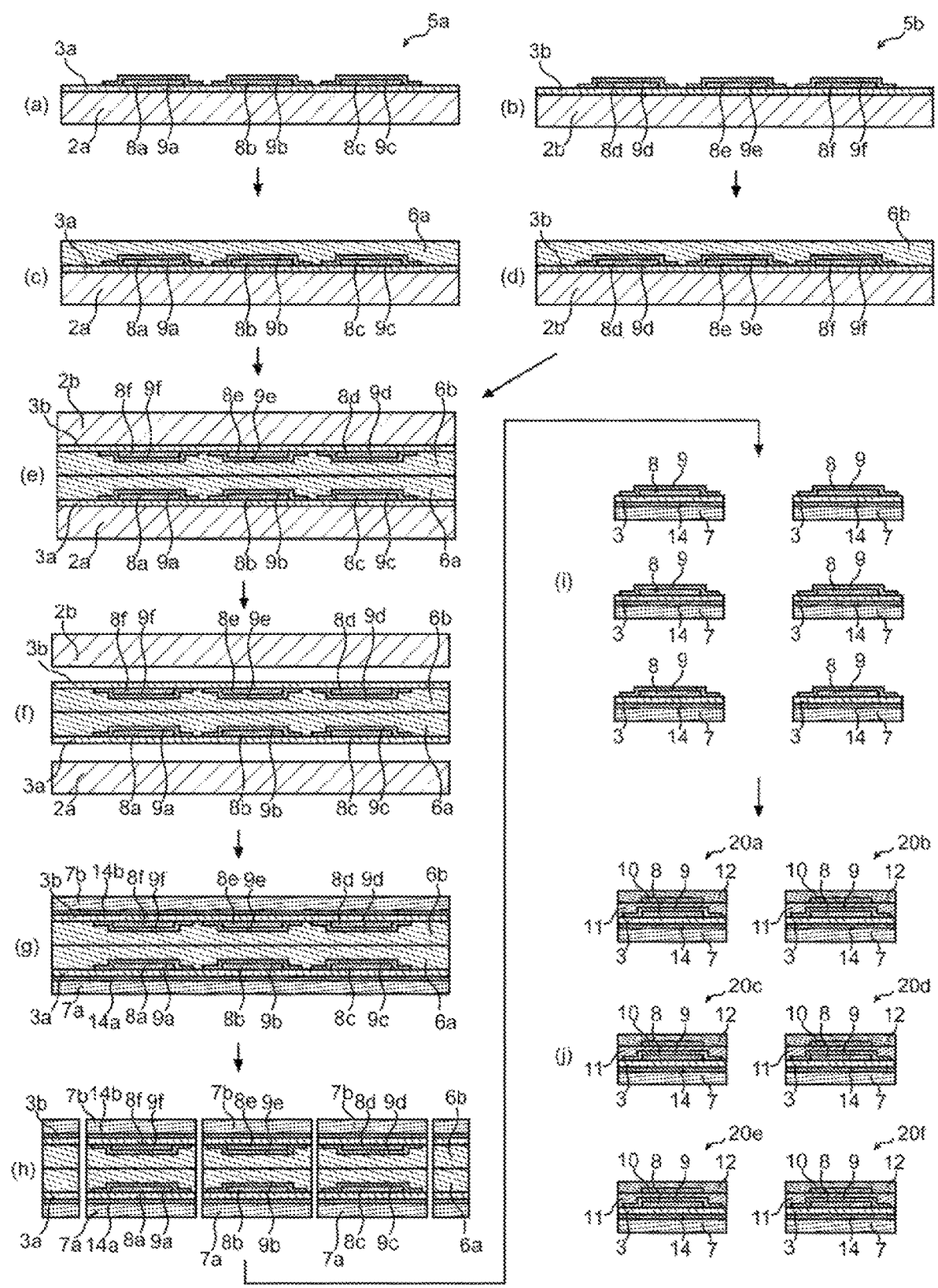
FIGS. 1(a) to 1(j) are explanatory diagrams of a display device manufacturing method according to an embodiment of the disclosure.

A display device manufacturing method according to the disclosure includes the steps of forming a first resin layer serving as a first flexible substrate on a first mother substrate, forming a first light-emitting layer on the first resin layer, and forming, on the first light-emitting layer, a first encapsulating layer encapsulating the first light-emitting layer, forming a second resin layer serving as a second flexible substrate on a second mother substrate, forming a second light-emitting layer on the second resin layer, and forming, on the second light-emitting layer, a second encapsulating layer encapsulating the second light-emitting layer, bonding the first mother substrate and the second mother substrate with a buffer sheet interposed between the first mother substrate and the second mother substrate so that the first encapsulating layer and the second encapsulating layer face each other, peeling the first resin layer from the first mother substrate in a state where the first resin layer and the second resin layer are layered with the buffer sheet interposed between the first resin layer and the second resin layer, and bonding a first support film to the first resin layer.

It is preferable that the manufacturing method according to the disclosure further includes the steps of peeling the second resin layer from the second mother substrate in a state where the first resin layer and the second resin layer are layered with the buffer sheet interposed between the first resin layer and the second resin layer, bonding a second support film to the second resin layer, severing the first resin layer, the second resin layer, the buffer sheet, the first support film, and the second support film, and removing the severed buffer sheet from the first encapsulating layer and the second encapsulating layer. As a result, it is possible to improve the production efficiency and production yield of the display device.

It is preferable that the step of bonding the first mother substrate and the second mother substrate with the buffer sheet interposed between the first mother substrate and the second mother substrate is a step of attaching a first buffer sheet onto the first encapsulating layer, attaching a second buffer sheet onto the second encapsulating layer, and subsequently attaching the first buffer sheet and the second buffer sheet to each other. The first and second encapsulating layers can be protected by the first and second buffer sheets when the first and second mother substrates are bonded to each other.

It is preferable that the step of peeling the first resin layer from the first mother substrate is a step of reducing adhesion of a first interface between the first mother substrate and the first resin layer by irradiating the first interface with laser light, and peeling the first resin layer from the first mother substrate. It is preferable that the step of peeling the second resin layer from the second mother substrate is a step of reducing adhesion of a second interface between the second mother substrate and the second resin layer by irradiating the second interface with laser light, and peeling the second resin layer from the second mother substrate.

It is preferable that the first interface and the second interface are simultaneously irradiated with a laser. Therefore, a laser liftoff process can be performed simultaneously for the first and second mother substrates, and thus, the process time can be shortened. As a result, the production efficiency can be improved.

It is preferable that the first interface and the second interface are separately irradiated with a laser, and it is preferable that the step of bonding the first support film to the first resin layer is performed in a state where the second resin layer is not peeled from the second mother substrate. This enables the laser liftoff process with one laser light irradiation device, and thus, the equipment cost of the production line can be reduced. Furthermore, when the first support film is bonded to the first resin layer, the second mother substrate can be utilized for handling the first resin layer, and thus, the first support film can be easily bonded.

It is preferable that the step of bonding the first mother substrate and the second mother substrate with the buffer sheet interposed between the first mother substrate and the second mother substrate is a step of attaching a first main surface of the buffer sheet onto the first encapsulating layer, and attaching a second main surface of the buffer sheet on an opposite side of the first main surface, onto the second encapsulating layer. As a result of this step, the number of buffer sheets to be used can be reduced, and the manufacturing cost can be reduced.

It is preferable that the manufacturing method according to the disclosure further includes a step of providing a function layer and a protective cover on each of the first encapsulating layer and the second encapsulating layer after removing the severed buffer sheet.

It is preferable that a plurality of first layered portions in which the first resin layer, the first light-emitting layer, and the first encapsulating layer are layered are formed on the first mother substrate, and it is preferable that a plurality of second layered portions in which the second resin layer, the second light-emitting layer, and the second encapsulating layer are layered are formed on the second mother substrate.

It is preferable that the step of severing the first resin layer, the second resin layer, the buffer sheet, the first support film, and the second support film is a step of singulating each of the first layered portions and singulating each of the second layered portions.

The disclosure will be described in more detail below with reference to a plurality of embodiments. The drawings and configurations illustrated in the following description are examples, and the scope of the disclosure is not limited to the drawings and the content of the description below.

First Embodiment

FIGS. 1(a) to 1(j) are explanatory diagrams of a display device manufacturing method according to the present embodiment.

A manufacturing method of display devices 20a to 20f (hereinafter collectively referred to as "display device 20") according to the present embodiment includes the steps of forming a resin layer 3a serving as a first flexible substrate on a mother substrate 2a, forming light-emitting layers 8a to 8c on the resin layer 3a, and forming, on the light-emitting layers 8a to 8c, encapsulating layers 9a to 9c that seal the light-emitting layers 8a to 8c, forming a resin layer 3b serving as a second flexible substrate on a mother substrate 2b, forming light-emitting layers 8d to 8f on the resin layer 3b, and forming, on the light-emitting layers 8d to 8f, encapsulating layers 9d to 9f that seal the light-emitting layers 8d to 8f, bonding the mother substrate 2a and the mother substrate 2b with a buffer sheet 6 interposed between the mother substrate 2a and the mother substrate 2b so that the encapsulating layers 9a to 9c and the encapsulating layers 9d to 9f face each other, peeling the resin layer 3a from the mother substrate 2a in a state where the resin layer 3a and the resin layer 3b are layered with the buffer sheet 6 interposed between the resin layer 3a and the resin layer 3b, and bonding a support film 7a to the resin layer 3a.

The manufacturing method according to the present embodiment can include a step of peeling the resin layer 3b from the mother substrate 2b in a state where the resin layer 3a and the resin layer 3b are layered with the buffer sheet 6 interposed between the resin layer 3a and the resin layer 3b, can include a step of bonding a support film 7b to the resin layer 3b, can include a step of severing the resin layer 3a, the resin layer 3b, the buffer sheet 6, the support film 7a, and the support film 7b, and can include a step of removing the severed buffer sheet 6 from the encapsulating layers 9a to 9c and the encapsulating layers 9d to 9f. Furthermore, the manufacturing method according to the present embodiment can include a step of providing a function layer 10 and a protective cover 12 on the encapsulating layer 9 after the severed buffer sheet 6 is removed. Note that, in the following description, the mother substrates 2a and 2b are collectively referred to as a mother substrate 2.

Below, steps included in the manufacturing method of the present embodiment will be described.

First, a resin layer 3 is formed on the mother substrate 2. The mother substrate 2 (support substrate, carrier substrate) is a member serving as a support material and a carrier in the manufacturing process of the display device 20. The mother substrate 2 is, for example, a glass substrate. The resin layer 3 is a portion serving as a flexible substrate of the display device 20. The resin layer 3 is, for example, a polyimide layer, a polyethylene terephthalate (PET) layer, or a polyethylene naphthalate (PEN) layer. The resin layer 3 is preferably a polyimide layer.

If the resin layer 3 is a polyimide layer, the resin layer 3 (polyimide layer) can be formed on the mother substrate 2 by applying a polyamic acid solution to the mother substrate 2 and heating the applied film at 200° C. to 500° C. in a baking furnace.

A light-emitting layer 8 is formed on the resin layer 3. The light-emitting layer 8 includes a plurality of light-emitting elements arranged in a matrix shape. The light-emitting layer 8 includes a plurality of pixels arranged in a matrix shape. Each of the pixels includes a light-emitting element. Each of the light emitting elements included in the light-emitting layer 8 can include a thin film transistor layer (TFT layer) and an electroluminescent layer (EL layer). Each of the pixels can include a red EL layer, a blue EL layer, and a green EL layer (subpixels). The light-emitting layer 8 is, for example, an organic EL element matrix in which organic EL elements are arranged in a matrix shape.

A plurality of the light-emitting layers 8 may be formed on the resin layer 3. The plurality of light-emitting layers 8 may have the same configuration and the same shape. The plurality of light-emitting layers 8 may form a light-emitting layer array in which the plurality of light-emitting layers 8 are arranged in a matrix shape on the resin layer 3. When two layered substrates 5a and 5b are bonded to each other, the plurality of light-emitting layers 8 (the light-emitting layer array) can be provided so that each of the light-emitting layers 8 provided on the layered substrate 5a faces each of the light-emitting layers 8 provided on the layered substrate 5b. In a severing step described below, when between the two adjacent light-emitting layers 8, the resin layer 3 and the like are severed into a lattice shape, the plurality of light-emitting layers 8 on the resin layer 3 can be easily separated into individual light-emitting layers 8 (singulation process).

The light-emitting layer 8 can be formed by a film forming process using, for example, a sputtering method, a physical vapor deposition method, or a chemical vapor deposition method.

For example, a barrier layer is formed on the resin layer 3, a thin film transistor layer (TFT layer) and a wiring line are formed on the barrier layer, and a pixel circuit for each of the pixels is formed. An insulating layer is formed on the TFT layer, and an EL layer of each of the pixels is formed on the insulating layer. The EL layer is, for example, an organic EL layer. A terminal portion may be formed in a part of the wiring line.

Next, the encapsulating layer 9 is formed to cover the light-emitting layer 8. The encapsulating layer 9 is, for example, a silicon nitride layer, and an aluminum oxide layer. The encapsulating layer 9 may be formed such that each encapsulating layer 9 covers one light-emitting layer 9, or one encapsulating layer 9 covers a plurality of the light-emitting layers 8. During the formation of the encapsulating layer 9, a mask can be employed so that the encapsulating layer 9 is not formed on the terminal portion.

Thus, a plurality of the light-emitting layers 8 covered by the encapsulating layer 9 (layered portions) can be formed on the resin layer 3, and thus, the layered substrate 5 can be manufactured.

For example, it is possible to form the layered substrate 5a including the light-emitting layers 8a to 8c covered by the encapsulating layers 9a to 9c, as illustrated in FIG. 1(a), and the layered substrate 5b including the light-emitting layers 8d to 8f covered by the encapsulating layers 9d to 9f, as illustrated in FIG. 1(b).

Next, a buffer sheet 6a is attached on the plurality of encapsulating layers 9a to 9c of the layered substrate 5a, and a buffer sheet 6b is attached on the plurality of encapsulating layers 9d to 9f of the layered substrate 5b. The light-emitting layers 8a to 8f and the encapsulating layers 9a to 9f can be protected by the buffer sheets 6a and 6b.

A first main surface of the buffer sheet 6a can be attached to a surface of the layered substrate 5a on a side where the encapsulating layers 9a to 9c are formed, by intermolecular forces, electrostatic forces, or vacuum adsorption. A first main surface of the buffer sheet 6b can be attached to a surface of the layered substrate 5b on a side where the encapsulating layers 9d to 9f are formed, by intermolecular forces, electrostatic forces, or vacuum adsorption.

The buffer sheets 6, 6a, and 6b are, for example, a resin sheet such as an acrylic resin sheet, a polyethylene sheet, a polyethylene terephthalate sheet, a polyvinylidene chloride sheet, a polyvinyl chloride sheet, a polymethylpentene sheet and a polypropylene sheet. The buffer sheets 6, 6a, and 6b may be a multilayer sheet including the above-mentioned sheets. The thickness of each of the buffer sheets 6, 6a, and 6b is, for example, 10 μm or more and 100 μm or less.

For example, as illustrated in FIGS. 1(c) and 1(d), the buffer sheet 6a can be attached to the layered substrate 5a, and the buffer sheet 6b can be attached to the layered substrate 5b.

Next, a second main surface on a back side of the first main surface of the buffer sheet 6a and a second main surface on a back side of the first main surface of the buffer sheet 6b are attached to each other by intermolecular forces, electrostatic forces, or vacuum adsorption, and thus, the two layered substrates 5a and 5b are bonded with the buffer sheets 6a and 6b interposed between the two layered substrates 5a and 5b so that the light-emitting layers 8a to 8c of the layered substrate 5a and the light-emitting layers 8d to 8f of the layered substrate 5b face each other. The layered substrate 5a and the layered substrate 5b can be bonded so that the positions of the light-emitting layers 8a to 8c of the layered substrate 5a coincide with the positions of the light-emitting layers 8d to 8f of the layered substrate 5b. The two layered substrates 5a and 5b may have the same configuration and the same shape. The layered substrates 5a and 5b are bonded so that the plurality of light-emitting layers 8a to 8c of the layered substrate 5a and the plurality of light-emitting layers 8d to 8f of the layered substrate 5b are on the inside of the layered substrates 5a and 5b, and thus, the light-emitting layers 8a to 8f and the encapsulating layers 9a to 9f can be protected.

For example, as illustrated in FIG. 1(e), the two layered substrates 5a and 5b can be bonded so that the position of the light-emitting layer 8a and the position of the light-emitting layer 8f coincide with each other, the position of the light-emitting layer 8b and the position of the light-emitting layer 8e coincide with each other, and the position of the light-emitting layer 8c and the position of the light-emitting layer 8d coincide with each other.

Next, the resin layer 3a is peeled from the mother substrate 2a, and the resin layer 3b is peeled from the mother substrate 2b. The layered substrates 5a and 5b are bonded using the buffer sheet 6, and thus, sufficient strength of the layered body can be secured on the side of the resin layers 3a and 3b when the resin layers 3a and 3b are peeled from the mother substrates 2a and 2b. For example, as illustrated in FIG. 1(*f*), the resin layers 3*a* and 3*b* can be peeled from the mother substrates 2*a* and 2*b*.

A laser liftoff process can be employed for removing the resin layer 3 from the mother substrate 2. Specifically, adhesion of an interface between the mother substrate 2 and the resin layer 3 is reduced by irradiating the interface with laser light, and then the resin layer 3 can be peeled from the mother substrate 2. For example, if the mother substrate 2 is a glass substrate and the resin layer 3 is a polyimide layer, an excimer laser having a wavelength of 308 nm can be employed for line beam scanning from the side of the mother substrate 2 to the interface between the mother substrate 2 and the resin layer 3.

The interface between the mother substrate 2*a* and the resin layer 3*a* and the interface between the mother substrate 2*b* and the resin layer 3*b* may be simultaneously irradiated with a laser. As a result, the processing time can be shortened, and the production efficiency can be improved.

The interface between the mother substrate 2*b* and the resin layer 3*b* may be irradiated with laser light after the interface between the mother substrate 2*a* and the resin layer 3*a* is irradiated with laser light. This enables the laser liftoff process with one laser light irradiation device.

Next, the support film 7*a* is bonded to the resin layer 3*a*, and the support film 7*b* is bonded to the resin layer 3*b*. The support film 7*a* can be bonded to a main surface of the resin layer 3*a* peeled from the mother substrate 2*a*, and the support film 7*b* can be bonded to a main surface of the resin layer 3*b* peeled from the mother substrate 2*b*. The plurality of light-emitting layers 8*a* to 8*c* on the resin layer 3*a* and the light-emitting layers 8*d* to 8*f* on the resin layer 3*b* are bonded with the buffer sheets 6*a* and 6*b* interposed between the plurality of light-emitting layers 8*a* to 8*c* and the light-emitting layers 8*d* to 8*f*, and thus, the layered body including the resin layers 3*a* and 3*b* can have sufficient strength, and a support film 7 can be easily bonded. For example, as illustrated in FIG. 1(*g*), the support films 7*a* and 7*b* can be bonded to the resin layers 3*a* and 3*b*, respectively.

The support film 7 is a film serving as a flexible substrate of the display device 20 together with the resin layer 3. The support film 7 is, for example, a resin film such as a polyimide film, a polyethylene terephthalate (PET) film, or a polyethylene naphthalate (PEN) film. An adhesive layer 14 may be provided between the resin layer 3 and the support film 7.

Next, the support films 7*a* and 7*b*, the resin layers 3*a* and 3*b*, and the buffer sheets 6*a* and 6*b* are severed between two adjacent light-emitting layers 8 provided on the resin layer 3*a* and between the two adjacent light-emitting layers 8 provided on the resin layer 3*b*, and thus, the plurality of light-emitting layers 8 provided on the resin layer 3*a* are separated into individual light-emitting layers 8, and the plurality of light-emitting layers 8 provided on the resin layer 3*b* are separated into individual light-emitting layers 8 (singulation process). At this stage, one of the light-emitting layers 8 on the resin layer 3*a* and one of the light-emitting layers 8 on the resin layer 3*b* facing the one light-emitting layer 8 on the resin layer 3*a* are bonded with the buffer sheets 6*a* and 6*b* interposed between the one of the light-emitting layers 8 on the resin layer 3*a* and the one of the light-emitting layers 8 on the resin layer 3*b*, and thus, the two light-emitting layers 8 form a pair. A plurality of the pairs obtained after being severed may have the same configuration and the same shape.

Thus, the severing step is performed in a state where the resin layer 3*a* provided with the plurality of light-emitting layers 8 and the resin layer 3*b* provided with the plurality of light-emitting layers 8 are bonded to each other, and thus, It is possible to collectively divide the plurality of light-emitting layers 8 on the resin layer 3*a* and the plurality of light-emitting layers 8 on the resin layer 3*b*, into components (forming pairs at this stage) each of which includes the light-emitting layers 8 (layered portion) each covered by one of the encapsulating layers 9. As a result, the production efficiency can be improved.

A laser severing technique using a $CO_2$ laser, a YAG laser, a YVO laser, or the like may be employed for the severing process. That is, a laser cutting technique in which laser light is emitted from above the resin layer 3*a* or the resin layer 3*b* can be employed. As a result, it is possible to efficiently divide each of a plurality of first layered portions on the side of the resin layer 3*a* and a plurality of second layered portions on the side of the resin layer 3*b*.

For example, as illustrated in FIG. 1(*h*), the support films 7*a* and 7*b*, the resin layers 3*a* and 3*b*, and the buffer sheets 6*a* and 6*b* can be severed between the light-emitting layers 8*a* and 8*f* and the light-emitting layers 8*b* and 8*e* and between the light-emitting layers 8*b* and 8*e* and the light-emitting layers 8*c* and 8*d*, and can be divided into a portion including a pair of the light-emitting layers 8*a* and 8*f*, a portion including a pair of the light-emitting layers 8*b* and 8*e*, and a portion including a pair of the light-emitting layers 8*c* and 8*d*.

Next, the buffer sheets 6*a* and 6*b* are removed from the encapsulating layer 9, and the two light-emitting layers 8 forming a pair are divided. As a result, the plurality of light-emitting layers 8 formed on the resin layers 3*a* and 3*b* can be divided into components including one of the light-emitting layers 8. The buffer sheets 6*a* and 6*b* can be easily removed from the light-emitting layer 8 by utilizing the attachment of the buffer sheets 6*a* and 6*b* by intermolecular forces, electrostatic forces, or vacuum adsorption.

For example, as illustrated in FIG. 1(*i*), if the buffer sheets 6*a* and 6*b* are removed, the light-emitting layer 8*f* is separated from the light-emitting layer 8*a*, the light-emitting layer 8*e* is separated from the light-emitting layer 8*b*, and the light-emitting layer 8*d* is separated from the light-emitting layer 8*c*, and thus, it is possible to obtain six components each including one of the light-emitting layers 8.

Next, a part of the encapsulating layer 9 is removed, and the terminal portion is exposed (terminal exposure). Power can be supplied and a signal can be sent to the TFT layer and the EL layer via the terminal portion. The terminal exposure may be performed in a state where the buffer sheets 6*a* and 6*b* remain on the encapsulating layer 9. The terminal exposure may be performed before the layered substrates 5*a* and 5*b* are bonded to each other. If each of the encapsulating layers 9 is formed to cover one of the light-emitting layers 8 by using a mask, and if the encapsulating layer 9 is not formed on the terminal portion by using a mask, the terminal exposure step is not necessary.

Next, an adhesive layer 11, the function layer 10, and the protective cover 12 are formed on the encapsulating layer 9 covering each of the light-emitting layers 8. This makes it possible to manufacture a plurality of display devices 20*a* to 20*f*. The function layer 10 can include a circular polarizer (λ/4 plate+linear polarizer) and a touch panel. For example, the plurality of the display devices 20*a* to 20*f* are formed as illustrated in FIG. 1(*j*).

For example, the protective cover 12 such as a polyimide layer is formed on a counter substrate, and the function layer 10 is formed on the protective cover 12. Then, the display device 20 can be manufactured by bonding the function layer 10 and the encapsulating layer 9 with the adhesive layer 11 interposed between the function layer 10 and the encapsulating layer 9 and removing the counter substrate from the protective cover 12.

Second Embodiment

Figure 2:
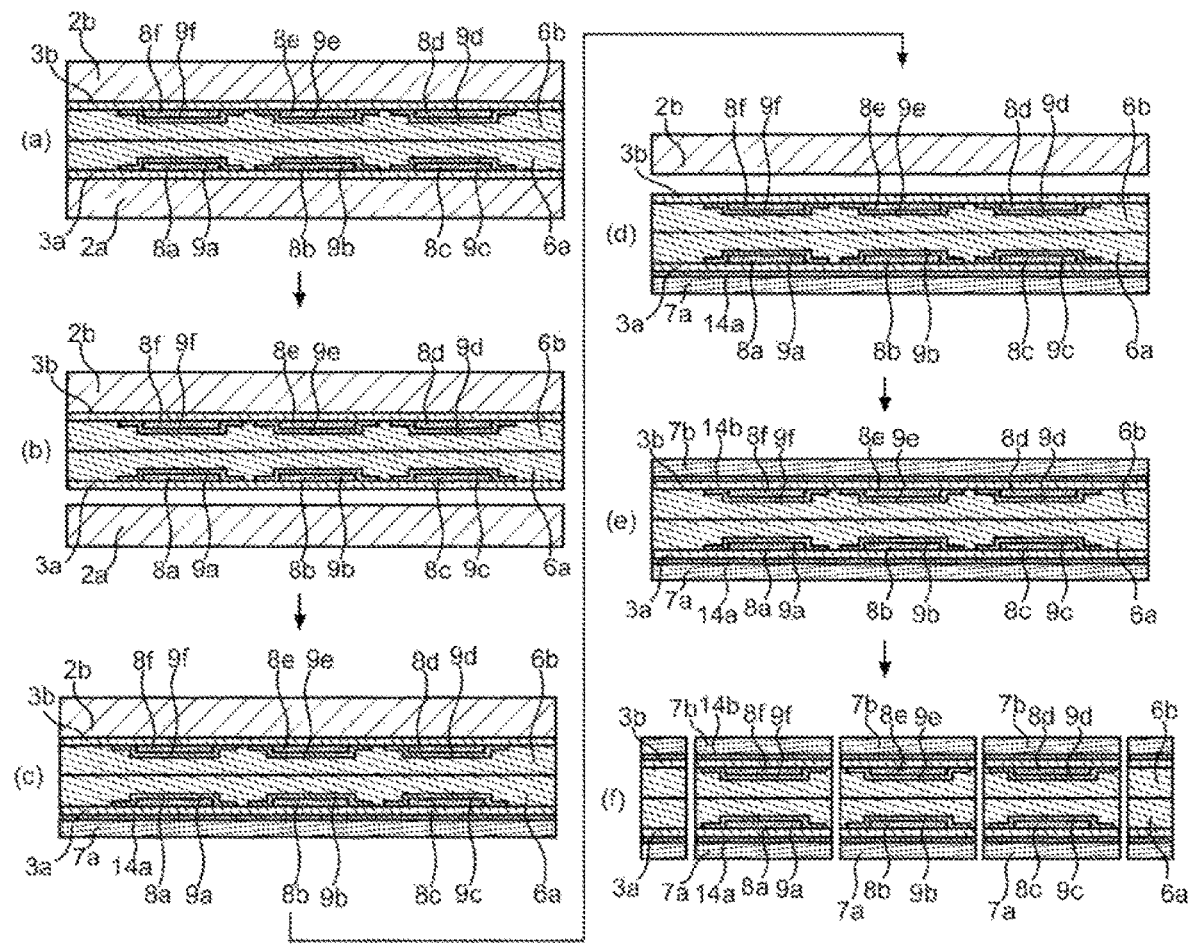
FIGS. 2(a) to 2(f) are explanatory diagrams of a display device manufacturing method according to an embodiment of the disclosure.

FIG. 2 is an explanatory diagram of a display device manufacturing method according to the present embodiment. The process is the same as that of the first embodiment until the two layered substrates 5a and 5b are bonded with the buffer sheets 6a and 6b interposed between the two layered substrates 5a and 5b.

In the second embodiment, the support film 7a is bonded to the resin layer 3a after the mother substrate 2a is peeled from the resin layer 3a and before the mother substrate 2b is peeled from the resin layer 3b. Accordingly, when the support film 7a is bonded to the resin layer 3a, the mother substrate 2b can be utilized for handling the resin layer 3a, and thus, the support film 7a can be easily bonded.

For example, as illustrated in FIGS. 2(b) and 2(c), the mother substrate 2a can be peeled from the resin layer 3a, and the support film 7a can be bonded to the resin layer 3a.

Next, as illustrated in FIGS. 2(d) and 2(e), the mother substrate 2b is peeled from the resin layer 3b, and the support film 7b is bonded to the resin layer 3b. At this time, the mother substrate 2b can be utilized for handling the resin layer 3b, and thus, the support film 7b can be easily bonded.

The subsequent steps are the same as those in the first embodiment.

Other configurations and steps are similar to those in the first embodiment. The description of the first embodiment also applies to the second embodiment unless there is a contradiction.

Third Embodiment

Figure 3:
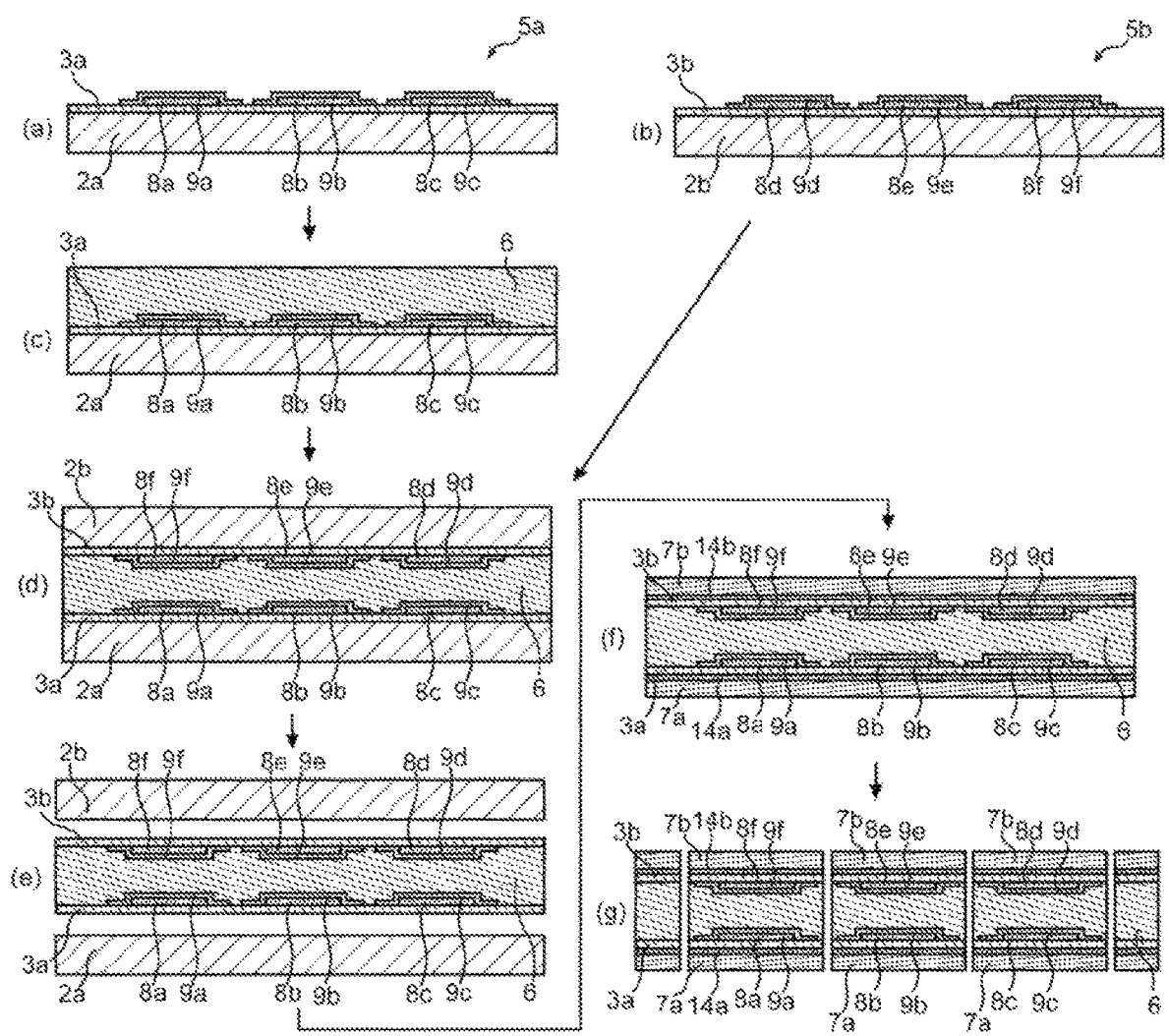
FIGS. 3(a) to 3(g) are explanatory diagrams of a display device manufacturing method according to an embodiment of the disclosure.

FIG. 3 is an explanatory diagram of a display device manufacturing method according to the present embodiment. The process is the same as that of the first embodiment until the resin layer 3, the plurality of light-emitting layers 8, and the encapsulating layer 9 are formed on the mother substrate 2.

In the third embodiment, the first main surface of one of the buffer sheets 6 is attached onto the encapsulating layers 9a to 9c of the layered substrate 5a, and the second main surface on the back side of the first main surface of the buffer sheet 6 is attached onto the encapsulating layers 9d to 9f of the layered substrate 5b, and thus, the layered substrate 5a and the layered substrate 5b are bonded to each other. As a result, the two layered substrates 5a and 5b can be bonded to each other with the one buffer sheet 6, and thus, the manufacturing cost can be reduced.

For example, as illustrated in FIG. 3(c), one of the main surfaces of the buffer sheet 6 can be attached onto the encapsulating layers 9a to 9c of the layered substrate 5a, and the main surface on the back side of the buffer sheet 6 can be attached onto the encapsulating layers 9d to 9f of the layered substrate 5b, as illustrated in FIG. 3(d).

The subsequent steps are the same as to those in the first embodiment except that the two layered substrates 5a and 5b are bonded by using the one buffer sheet 6.

Other configurations and steps are similar to those in the first and second embodiments. The descriptions of the first and second embodiments also apply to the third embodiment unless there is a contradiction.

Fourth Embodiment

Figure 4:
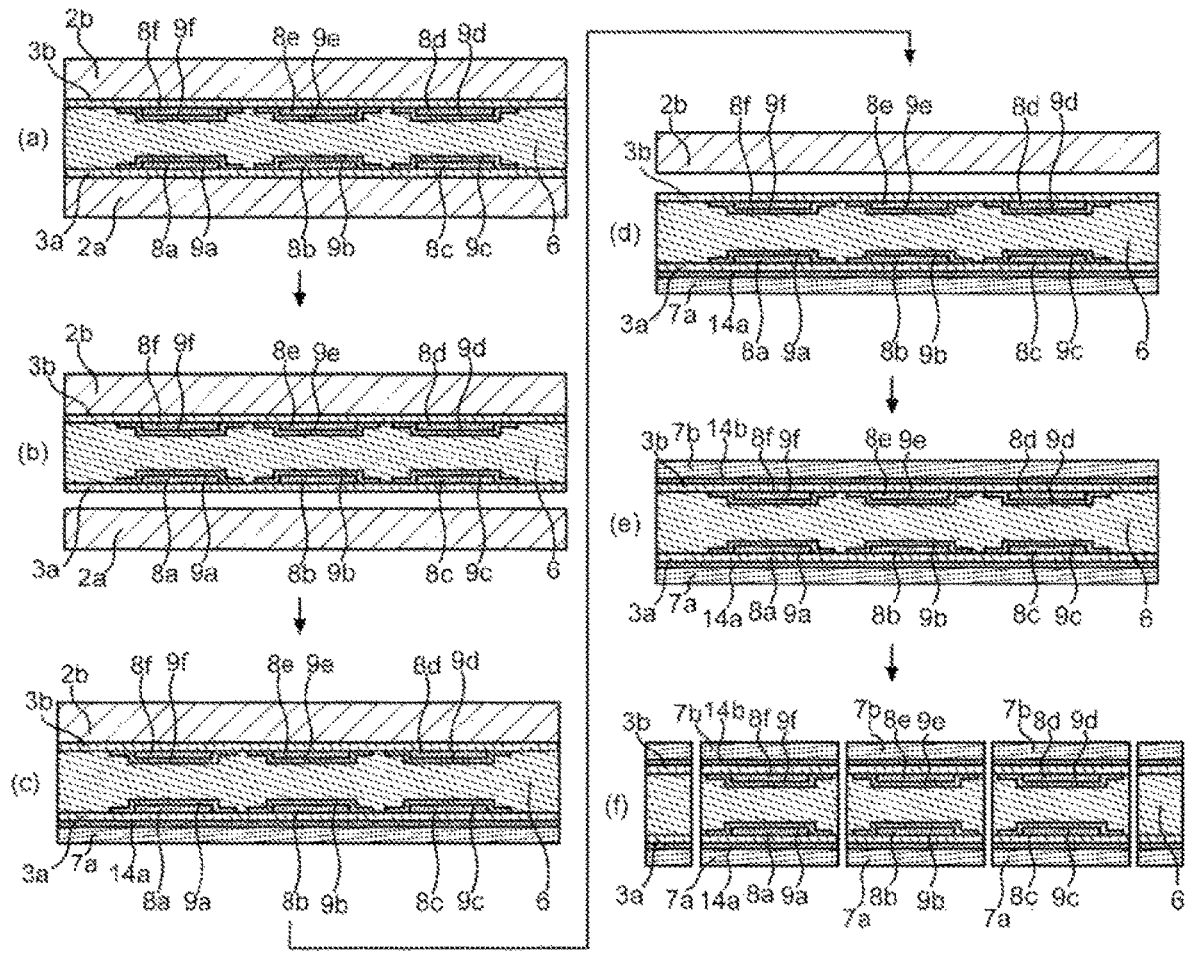
FIGS. 4(a) to 4(f) are explanatory diagrams of a display device manufacturing method according to an embodiment of the disclosure.

FIG. 4 is an explanatory diagram of a display device manufacturing method according to the present embodiment. The process is the same as that of the first embodiment until the resin layer 3, the plurality of light-emitting layers 8 and encapsulating layers 9 are formed on the mother substrate 2.

In the fourth embodiment, similarly to the third embodiment, the first main surface of one of the buffer sheets 6 is attached onto the encapsulating layers 9a to 9c of the layered substrate 5a, and the second main surface on the back side of the first main surface of the buffer sheet 6 is attached onto the plurality of encapsulating layers 9d to 9f of the layered substrate 5b, and thus, the layered substrate 5a and the layered substrate 5b are bonded to each other.

In the fourth embodiment, similarly to the second embodiment, the support film 7a is bonded to the resin layer 3a after the mother substrate 2a is peeled from the resin layer 3a and before the mother substrate 2b is peeled from the resin layer 3b. Subsequently, the mother substrate 2b is peeled from the resin layer 3b, and the support film 7b is bonded to the resin layer 3b.

The subsequent steps are the same as to those in the first embodiment except that the two layered substrates 5a and 5b are bonded by using the one buffer sheet 6.

Other configurations and steps are similar to those in the first to third embodiments. The descriptions of the first to third embodiments also apply to the fourth embodiment unless there is a contradiction.

The invention claimed is:

1. A manufacturing method of a display device, the manufacturing method comprising:
   forming a first resin layer serving as a first flexible substrate on a first mother substrate, forming a first light-emitting layer on the first resin layer, and forming, on the first light-emitting layer, a first encapsulating layer encapsulating the first light-emitting layer;
   forming a second resin layer serving as a second flexible substrate on a second mother substrate, forming a second light-emitting layer on the second resin layer, and forming, on the second light-emitting layer, a second encapsulating layer encapsulating the second light-emitting layer;
   bonding the first mother substrate and the second mother substrate with a buffer sheet interposed between the first mother substrate and the second mother substrate, the first encapsulating layer and the second encapsulating layer facing each other;
   peeling the first resin layer from the first mother substrate in a state where the first resin layer and the second resin layer are layered with the buffer sheet interposed between the first resin layer and the second resin layer;
   bonding a first support film to the first resin layer;
   peeling the second resin layer from the second mother substrate in a state where the first resin layer and the second resin layer are layered with the buffer sheet interposed between the first resin layer and the second resin layer;
   bonding a second support film to the second resin layer;
   severing the first resin layer, the second resin layer, the buffer sheet, the first support film, and the second support film so that the buffer sheet is severed into a plurality of severed buffer sheets; and
   removing the plurality of severed buffer sheets from the first encapsulating layer and the second encapsulating layer.

2. The manufacturing method according to claim 1, wherein bonding the first mother substrate and the second mother substrate with the buffer sheet interposed between the first mother substrate and the second mother substrate comprises attaching a first buffer sheet onto the first encapsulating layer, attaching a second buffer sheet onto the second encapsulating layer, and subsequently attaching the first buffer sheet and the second buffer sheet to each other.

3. The manufacturing method according to claim 1, wherein peeling the first resin layer from the first mother substrate comprises reducing adhesion of a first interface between the first mother substrate and the first resin layer by irradiating the first interface with laser light, and peeling the first resin layer from the first mother substrate, peeling the second resin layer from the second mother substrate comprises reducing adhesion of a second interface between the second mother substrate and the second resin layer by irradiating the second interface with the laser light, and peeling the second resin layer from the second mother substrate, and the first interface and the second interface are simultaneously irradiated with a laser.

4. The manufacturing method according to claim 1, wherein peeling the first resin layer from the first mother substrate comprises reducing adhesion of a first interface between the first mother substrate and the first resin layer by irradiating the first interface with laser light, and peeling the first resin layer from the first mother substrate, peeling the second resin layer from the second mother substrate comprises reducing adhesion of a second interface between the second mother substrate and the second resin layer by irradiating the second interface with the laser light, and peeling the second resin layer from the second mother substrate, the first interface and the second interface are separately irradiated with a laser, and bonding the first support film to the first resin layer is performed in a state where the second resin layer is not peeled from the second mother substrate.

5. The manufacturing method according to claim 1, wherein bonding the first mother substrate and the second mother substrate with the buffer sheet interposed between the first mother substrate and the second mother substrate comprises attaching a first main surface of the buffer sheet onto the first encapsulating layer, and attaching a second main surface of the buffer sheet on an opposite side of the first main surface, onto the second encapsulating layer.

6. The manufacturing method according to claim 5, wherein bonding the first support film to the first resin layer is performed in a state where the second resin layer is not peeled from the second mother substrate.

7. The manufacturing method according to claim 1, further comprising providing a function layer and a protective cover on each of the first encapsulating layer and the second encapsulating layer after removing the plurality of severed buffer sheets.

8. The manufacturing method according to claim 1, wherein a plurality of first layered portions in which the first resin layer, the first light-emitting layer, and the first encapsulating layer are layered are formed on the first mother substrate, and a plurality of second layered portions in which the second resin layer, the second light-emitting layer, and the second encapsulating layer are layered are formed on the second mother substrate.

9. The manufacturing method according to claim 8, wherein severing the first resin layer, the second resin layer, the buffer sheet, the first support film, and the second support film comprises singulating each of the plurality of first layered portions and singulating each of the plurality of second layered portions.

10. The manufacturing method according to claim 8, wherein severing the first resin layer, the second resin layer, the buffer sheet, the first support film, and the second support film is performed through laser light irradiation from above the first resin layer or the second resin layer.

* * * * *